United States Patent
Choi

(10) Patent No.: US 10,903,191 B2
(45) Date of Patent: Jan. 26, 2021

(54) SEMICONDUCTOR CHIP FOR REPAIRING THROUGH ELECTRODE

(71) Applicant: SK hynix Inc., Icheon-si (KR)

(72) Inventor: Sun Myung Choi, Seoul (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/685,667

(22) Filed: Nov. 15, 2019

(65) Prior Publication Data

US 2020/0350289 A1 Nov. 5, 2020

(30) Foreign Application Priority Data

May 2, 2019 (KR) .................. 10-2019-0051864

(51) Int. Cl.
*H01L 25/00* (2006.01)
*H01L 25/065* (2006.01)
*G11C 7/10* (2006.01)
*G11C 29/44* (2006.01)

(52) U.S. Cl.
CPC ........ *H01L 25/0657* (2013.01); *G11C 7/1069* (2013.01); *G11C 7/1096* (2013.01); *G11C 29/4401* (2013.01); *H01L 2225/06541* (2013.01); *H01L 2225/06596* (2013.01)

(58) Field of Classification Search
CPC ....... H01L 25/0657; H01L 2225/06541; H01L 2225/06596; G11C 7/1069; G11C 7/1096; G11C 29/4401
See application file for complete search history.

(56) References Cited

U.S. PATENT DOCUMENTS

| | | | | |
|---|---|---|---|---|
| 8,198,915 B2* | 6/2012 | Yoko | ............... | H03K 19/01852 326/56 |
| 8,310,382 B2* | 11/2012 | Ide | ........................ | G11C 5/02 341/100 |
| 8,384,417 B2* | 2/2013 | Laisne | ............... | H01L 25/0657 326/10 |
| 8,584,061 B2* | 11/2013 | Shibata | ................ | G11C 5/063 716/100 |
| 8,922,237 B2* | 12/2014 | Ku | ......................... | H01L 22/22 324/762.01 |
| 9,972,611 B2* | 5/2018 | Pappu | ..................... | H01L 22/22 |
| 10,146,719 B2* | 12/2018 | Kondo | ................ | G11C 7/1069 |
| 2010/0060310 A1 | 3/2010 | Laisne et al. | | |

FOREIGN PATENT DOCUMENTS

KR 1020130093342 A 8/2013

* cited by examiner

*Primary Examiner* — Vanthu T Nguyen
(74) *Attorney, Agent, or Firm* — William Park & Associates Ltd.

(57) ABSTRACT

A semiconductor chip includes a first semiconductor device and a second semiconductor device stacked and coupled through a unidirectional through electrode and a plurality of bidirectional through electrodes, wherein a through electrode in which a failure has occurred among the unidirectional through electrode and the plurality of bidirectional through electrodes is replaced based on a plurality of transfer control signals. The plurality of transfer control signals including failure information on the unidirectional through electrode and the plurality of bidirectional through electrodes.

18 Claims, 8 Drawing Sheets

SEMICONDUCTOR CHIP FOR REPAIRING THROUGH ELECTRODE

CROSS-REFERENCE TO RELATED APPLICATION

The present application claims priority under 35 U.S.C. § 119(a) to Korean Patent Application No. 10-2019-0051864 filed on May 2, 2019 in the Korean Intellectual Property Office, which is incorporated herein by reference in its entirety.

BACKGROUND

1. Technical Field

Embodiments of the disclosure generally relate to a semiconductor chip, and more particularly, to through electrodes.

2. Related Art

Recently, a type of 3D (three-dimensional) semiconductor device capable of increasing the degree of integration has been developed. In the 3D semiconductor device, as a plurality of semiconductor devices are vertically stacked, the maximum degree of integration may be realized within the same space.

In order to realize such a 3D semiconductor device, a TSV (through silicon via) method is used, in which vias are formed to pass through a plurality of stacked chips such that all the chips are electrically coupled with one another through the vias. In the semiconductor device using TSVs, because the vias vertically pass through the respective chips to couple them with one another, the area of a package may be efficiently reduced when compared to a semiconductor device in which respective chips are coupled with one another through wire bonding using wires.

TSVs of a semiconductor device are verified through various tests before the semiconductor device is placed on the market as a product. In this regard, various methods for repairing a TSV in which a failure occurs as a result of testing are demanded in the art.

SUMMARY

In an embodiment, a semiconductor chip may include: a first semiconductor device and a second semiconductor device stacked and coupled through a unidirectional through electrode and a plurality of bidirectional through electrodes, wherein a through electrode in which a failure has occurred among the unidirectional through electrode and the plurality of bidirectional through electrodes is replaced based on a plurality of transfer control signals. The transfer control signals may include failure information on the unidirectional through electrode and the plurality of bidirectional through electrodes.

In an embodiment, a semiconductor chip may include: a first semiconductor device coupled to a unidirectional through electrode and first to fourth bidirectional through electrodes, wherein a through electrode in which a failure has occurred among the unidirectional through electrode and the first to fourth bidirectional through electrodes is replaced based on first to fifth transfer control signals. The first to fifth transfer control signals including failure information on the unidirectional through electrode and the first to fourth bidirectional through electrodes.

DETAILED DESCRIPTION

Hereinafter, a semiconductor chip will be described below with reference to the accompanying drawings through various examples of embodiments.

Various embodiments may be directed to a semiconductor chip which replaces a unidirectional through electrode with a bidirectional through electrode and replaces a bidirectional through electrode with another bidirectional through electrode in a repair operation during a write operation and a read operation.

According to the embodiments, by replacing a unidirectional through electrode with a bidirectional through electrode and replacing a bidirectional through electrode with another bidirectional through electrode in a repair operation during a write operation and a read operation, it may be possible to increase efficiency for repairing a semiconductor chip in which a through electrode has failed. In an embodiment, a repair operation may include replacing a through electrode that has failed with another through electrode that has not failed so that signals that are to be transferred through the failed through electrode can now be transferred through the through electrode that has not failed. In an embodiment, replacing a through electrode or path of a through electrode in which a fail has occurred with another through electrode or path of another through electrode means that that the other through electrode or path of the other through electrode assumes the functionality previously performed by the through electrode or path of the through electrode before its failure.

For reference, an embodiment including additional components may be provided. Furthermore, a logic high or logic low configuration indicating an enabled or disabled state of a signal or circuit may be changed depending on embodiments. Furthermore, the configuration of a logic gate or logic gates required for implementing the same function or operation may be modified. That is, the logic gate configuration of one type of operation and another logic gate configuration for the same type of operation may be replaced with each other, depending on a specific situation. If necessary, various logic gates may be applied to implement the configurations.

Figure 1:
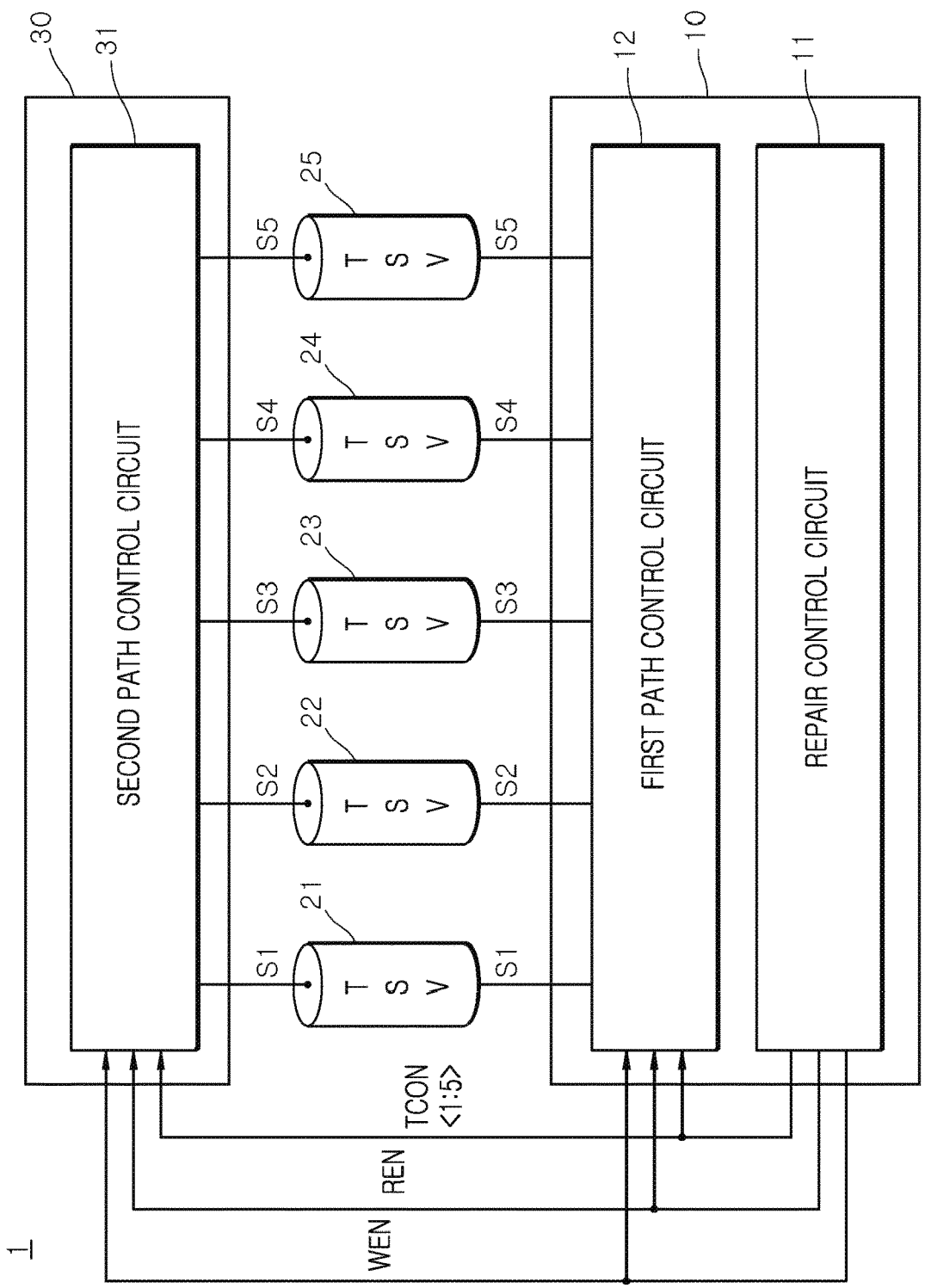
FIG. 1 is a block diagram illustrating a representation of an example of the configuration of a semiconductor chip in accordance with an embodiment.

As illustrated in FIG. 1, a semiconductor chip 1 in accordance with an embodiment may include a first semiconductor device 10, a unidirectional through electrode 21, a first bidirectional through electrode 22, a second bidirectional through electrode 23, a third bidirectional through electrode 24, a fourth bidirectional through electrode 25 and a second semiconductor device 30. The first semiconductor device 10 may be stacked with the second semiconductor device 30 and couple to each other through the unidirectional through electrode 21, the first bidirectional through electrode 22, the second bidirectional through electrode 23, the third bidirectional through electrode 24 and the fourth bidirectional through electrode 25. In some embodiments, the second semiconductor device 30 may be stacked over the first semiconductor device 10. In other embodiments, the first semiconductor device 10 may be stacked over the second semiconductor device 30. While the first semiconductor device 10 and the second semiconductor device 30 are illustrated in FIG. 1 as being stacked with each other and coupled to each other through five through electrodes (TSVs: through silicon vias), it is to be noted that the number of through electrodes for electrically coupling the first semiconductor device 10 with the second semiconductor device 30 may be set variously depending on an embodiment.

The first semiconductor device 10 may include a repair control circuit 11 and a first path control circuit 12.

The repair control circuit 11 may generate a write enable signal WEN which is enabled in a write operation. The repair control circuit 11 may generate a read enable signal REN which is enabled in a read operation. The repair control circuit 11 may generate first to fifth transfer control signals TCON<1:5> in a write operation and a read operation. The first to fifth transfer control signals TCON<1:5> may be set as signals including failure information on the unidirectional through electrode 21, the first bidirectional through electrode 22, the second bidirectional through electrode 23, the third bidirectional through electrode 24 and the fourth bidirectional through electrode 25. The first transfer control signal TCON<1> may be set as a signal which is enabled in the case where a failure occurs in the unidirectional through electrode 21. The second transfer control signal TCON<2> may be set as a signal which is enabled in the case where a failure occurs in the first bidirectional through electrode 22. The third transfer control signal TCON<3> may be set as a signal which is enabled in the case where a failure occurs in the second bidirectional through electrode 23. The fourth transfer control signal TCON<4> may be set as a signal which is enabled in the case where a failure occurs in the third bidirectional through electrode 24. The fifth transfer control signal TCON<5> may be set as a signal which is enabled in the case where a failure occurs in the fourth bidirectional through electrode 25.

The first path control circuit 12 may, in the case where the write enable signal WEN is enabled, replace the path of a through electrode in which a failure has occurred among the unidirectional through electrode 21, the first bidirectional through electrode 22, the second bidirectional through electrode 23, the third bidirectional through electrode 24 and the fourth bidirectional through electrode 25, with an adjacent through electrode, based on the first to fifth transfer control signals TCON<1:5>. The first path control circuit 12 may, in the case where the write enable signal WEN is enabled, output first to fifth signals S1, S2, S3, S4 and S5 through the unidirectional through electrode 21, the first bidirectional through electrode 22, the second bidirectional through electrode 23, the third bidirectional through electrode 24 and the fourth bidirectional through electrode 25 which are repaired. The first path control circuit 12 may, in the case where the read enable signal REN is enabled, replace the path of a through electrode in which a failure has occurred among the unidirectional through electrode 21, the first bidirectional through electrode 22, the second bidirectional through electrode 23, the third bidirectional through electrode 24 and the fourth bidirectional through electrode 25, with an adjacent through electrode, based on the first to fifth transfer control signals TCON<1:5>. The first path control circuit 12 may, in the case where the read enable signal REN is enabled, receive first to fifth signals S1, S2, S3, S4 and S5 through the unidirectional through electrode 21, the first bidirectional through electrode 22, the second bidirectional through electrode 23, the third bidirectional through electrode 24 and the fourth bidirectional through electrode 25 which are replaced.

The unidirectional through electrode 21, the first bidirectional through electrode 22, the second bidirectional through electrode 23, the third bidirectional through electrode 24 and the fourth bidirectional through electrode 25 may be realized by general through electrodes (TSVs: through silicon vias) for stacking the first semiconductor device 10 and the second semiconductor device 30. The unidirectional through electrode 21 may be realized as a through electrode (TSV: through silicon via) for transferring the first signal S1 generated in the first semiconductor device 10 to the second semiconductor device 30 in a write operation. Here, the term 'unidirectional' means the direction of a signal which is outputted from the first semiconductor device 10 to the second semiconductor device 30. The first bidirectional through electrode 22, the second bidirectional through electrode 23, the third bidirectional through electrode 24 and the fourth bidirectional through electrode 25 may be realized by through electrodes (TSVs: through silicon vias) for transferring the second to fifth signals S2, S3, S4 and S5 generated in the first semiconductor device 10 and the second semiconductor device 30 in a write operation and a read operation. Here, the term 'bidirectional' means the directions of signals which are inputted and outputted between the first semiconductor device 10 and the second semiconductor device 30. While semiconductor devices stacked through the first bidirectional through electrode 22, the second bidirectional through electrode 23, the third bidirectional through electrode 24 and the fourth bidirectional through electrode 25 illustrated in FIG. 1 are realized as two semiconductor devices including the first semiconductor device 10 and the second semiconductor device 30, it is to be noted that various numbers of semiconductor devices may be realized to be vertically stacked, depending on an embodiment.

The first semiconductor device 10 configured as mentioned above may replace a through electrode in which a failure has occurred among the unidirectional through electrode 21, the first bidirectional through electrode 22, the second bidirectional through electrode 23, the third bidirectional through electrode 24 and the fourth bidirectional through electrode 25, based on the first to fifth transfer control signals TCON<1:5> including failure information on the unidirectional through electrode 21, the first bidirectional through electrode 22, the second bidirectional through electrode 23, the third bidirectional through electrode 24 and the fourth bidirectional through electrode 25.

The second semiconductor device 30 may include a second path control circuit 31.

The second path control circuit 31 may, in the case where the write enable signal WEN is enabled, replace the path of a through electrode in which a failure has occurred among the unidirectional through electrode 21, the first bidirectional through electrode 22, the second bidirectional through electrode 23, the third bidirectional through electrode 24 and the fourth bidirectional through electrode 25, with an adjacent through electrode, based on the first to fifth transfer control signals TCON<1:5>. The second path control circuit 31 may, in the case where the write enable signal WEN is enabled, receive the first to fifth signals S1, S2, S3, S4 and S5 through the unidirectional through electrode 21, the first bidirectional through electrode 22, the second bidirectional through electrode 23, the third bidirectional through electrode 24 and the fourth bidirectional through electrode 25 which are replaced. The second path control circuit 31 may, in the case where the read enable signal REN is enabled, replace the path of a through electrode in which a failure has occurred among the unidirectional through electrode 21, the first bidirectional through electrode 22, the second bidirectional through electrode 23, the third bidirectional through electrode 24 and the fourth bidirectional through electrode 25, with an adjacent through electrode, based on the first to fifth transfer control signals TCON<1:5>. The second path control circuit 31 may, in the case where the read enable signal REN is enabled, output the first to fifth signals S1, S2, S3, S4 and S5 through the unidirectional through electrode 21, the first bidirectional through electrode 22, the second bidirectional through electrode 23, the third bidirectional through electrode 24 and the fourth bidirectional through electrode 25 which are replaced.

The second semiconductor device 30 configured as mentioned above may replace a through electrode in which a failure has occurred among the unidirectional through electrode 21, the first bidirectional through electrode 22, the second bidirectional through electrode 23, the third bidirectional through electrode 24 and the fourth bidirectional through electrode 25, based on the first to fifth transfer control signals TCON<1:5> including failure information on the unidirectional through electrode 21, the first bidirectional through electrode 22, the second bidirectional through electrode 23, the third bidirectional through electrode 24 and the fourth bidirectional through electrode 25.

Figure 2:
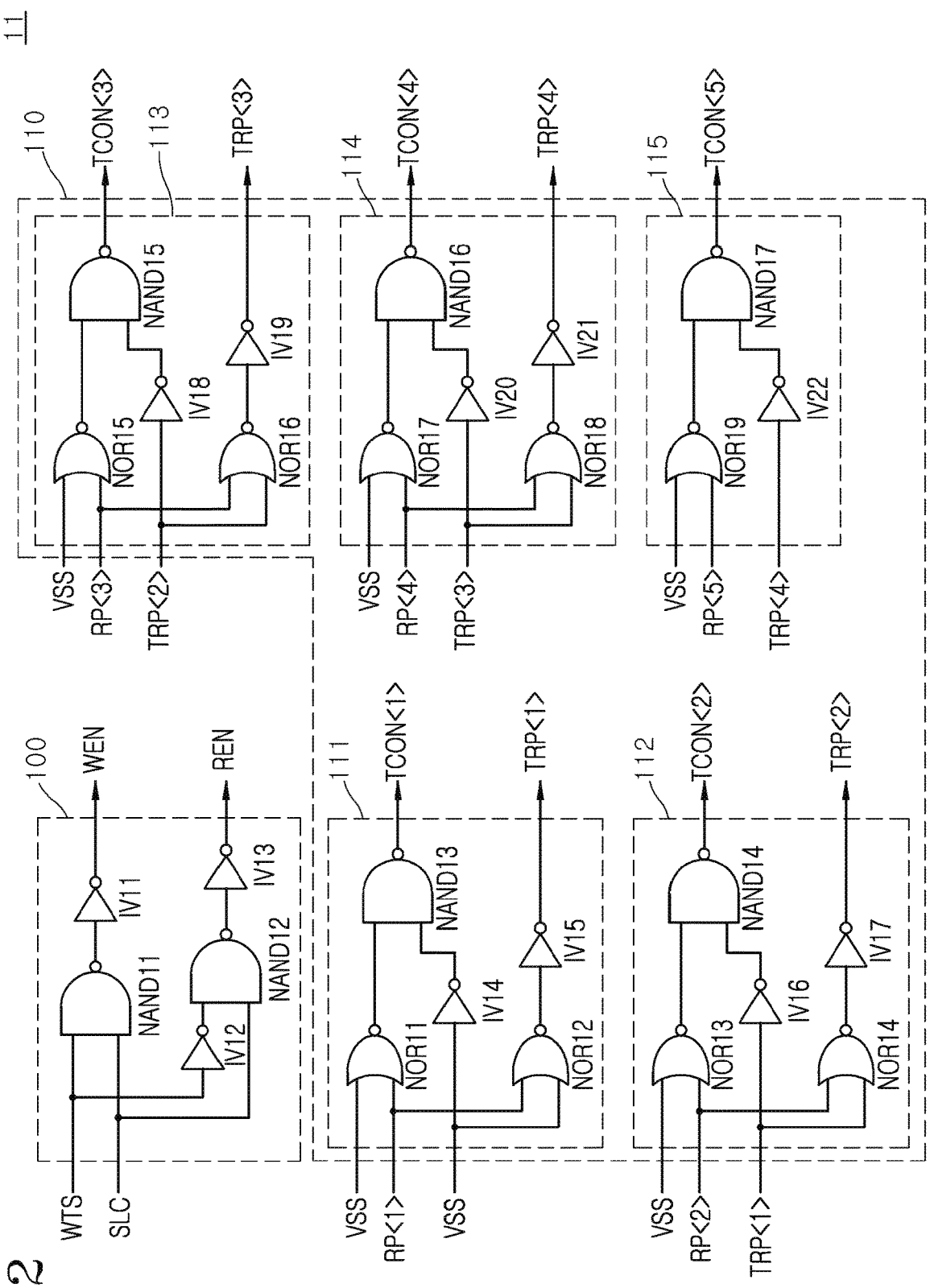
FIG. 2 is a circuit diagram illustrating a representation of an example of the configuration of a repair control circuit included in a first semiconductor device illustrated in FIG. 1.

Referring to FIG. 2, the repair control circuit 11 may include an enable signal generation circuit 100 and a transfer control signal generation circuit 110.

The enable signal generation circuit 100 may be realized by, for example but not limited to, inverters IV11, IV12 and IV13 and NAND gates NAND11 and NAND12. The enable signal generation circuit 100 may generate the write enable signal WEN and the read enable signal REN which are selectively enabled depending on the logic levels of a write start signal WTS and a slice signal SLC. The enable signal generation circuit 100 may generate the write enable signal WEN which is enabled to a logic high level, in the case where the slice signal SLC is enabled to a logic high level and the write start signal WTS is enabled to a logic high level. The enable signal generation circuit 100 may generate the read enable signal REN which is enabled to a logic high level, in the case where the slice signal SLC is enabled to a logic high level and the write start signal WTS is disabled to a logic low level. The write start signal WTS may be set as a signal which is enabled to a logic high level in a write operation and is disabled to a logic low level in a read operation. The slice signal SLC may be set as a signal which is enabled to a logic high level to perform a write operation and a read operation in the first semiconductor device 10 and the second semiconductor device 30.

The transfer control signal generation circuit 110 may include a first transfer control signal generation circuit 111, a second transfer control signal generation circuit 112, a third transfer control signal generation circuit 113, a fourth transfer control signal generation circuit 114, and a fifth transfer control signal generation circuit 115.

The first transfer control signal generation circuit 111 may be realized by, for example but not limited to, NOR gates NOR11 and NOR12, inverters IV14 and IV15, and a NAND gate NAND13. The first transfer control signal generation circuit 111 may generate the first transfer control signal TCON<1> and a first transfer repair signal TRP<1> depending on the logic level of a first repair information signal RP<1> by a ground voltage VSS. The first transfer control signal generation circuit 111 may generate the first transfer control signal TCON<1> which is enabled to a logic high level, in the case where the first repair information signal RP<1> is at a logic high level, by the ground voltage VSS of a logic low level. The first transfer control signal generation circuit 111 may generate the first transfer repair signal TRP<1> which is enabled to a logic high level, in the case where the first repair information signal RP<1> is at a logic high level, by the ground voltage VSS of a logic low level. The first repair information signal RP<1> may be set as a signal which is enabled to a logic high level, in the case where a failure occurs in the unidirectional through electrode 21.

The second transfer control signal generation circuit 112 may be realized by, for example but not limited to, NOR gates NOR13 and NOR14, inverters IV16 and IV17, and a NAND gate NAND14. The second transfer control signal generation circuit 112 may generate the second transfer control signal TCON<2> depending on the logic levels of a second repair information signal RP<2> and the first transfer repair signal TRP<1> by the ground voltage VSS. The second transfer control signal generation circuit 112 may generate the second transfer control signal TCON<2> which is enabled to a logic high level, in the case where the second repair information signal RP<2> is at a logic high level, by the ground voltage VSS of a logic low level. The second transfer control signal generation circuit 112 may generate the second transfer control signal TCON<2> which is enabled to a logic high level, in the case where the first transfer repair signal TRP<1> is at a logic high level. The second transfer control signal generation circuit 112 may generate a second transfer repair signal TRP<2> which is enabled to a logic high level, in the case where any one of the second repair information signal RP<2> and the first transfer repair signal TRP<1> is at a logic high level. The second repair information signal RP<2> may be set as a signal which is enabled to a logic high level in the case where a failure occurs in the first bidirectional through electrode 22.

The third transfer control signal generation circuit 113 may be realized by, for example but not limited to, NOR gates NOR15 and NOR16, inverters IV18 and IV19, and a NAND gate NAND15. The third transfer control signal generation circuit 113 may generate the third transfer control signal TCON<3> depending on the logic levels of a third repair information signal RP<3> and the second transfer repair signal TRP<2> by the ground voltage VSS. The third transfer control signal generation circuit 113 may generate the third transfer control signal TCON<3> which is enabled to a logic high level, in the case where the third repair information signal RP<3> is at a logic high level, by the ground voltage VSS of a logic low level. The third transfer control signal generation circuit 113 may generate the third transfer control signal TCON<3> which is enabled to a logic high level, in the case where the second transfer repair signal TRP<2> is at a logic high level. The third transfer control signal generation circuit 113 may generate a third transfer repair signal TRP<3> which is enabled to a logic high level, in the case where any one of the third repair information signal RP<3> and the second transfer repair signal TRP<2> is at a logic high level. The third repair information signal RP<3> may be set as a signal which is enabled to a logic high level in the case where a failure occurs in the second bidirectional through electrode 23.

The fourth transfer control signal generation circuit 114 may be realized by, for example but not limited to, NOR gates NOR17 and NOR18, inverters IV20 and IV21, and a NAND gate NAND16. The fourth transfer control signal generation circuit 114 may generate the fourth transfer control signal TCON<4> depending on the logic levels of a fourth repair information signal RP<4> and the third transfer repair signal TRP<3> by the ground voltage VSS. The fourth transfer control signal generation circuit 114 may generate the fourth transfer control signal TCON<4> which is enabled to a logic high level, in the case where the fourth repair information signal RP<4> is at a logic high level, by the ground voltage VSS of a logic low level.

The fourth transfer control signal generation circuit 114 may generate the fourth transfer control signal TCON<4> which is enabled to a logic high level, in the case where the third transfer repair signal TRP<3> is at a logic high level. The fourth transfer control signal generation circuit 114 may generate a fourth transfer repair signal TRP<4> which is enabled to a logic high level, in the case where any one of the fourth repair information signal RP<4>and the third transfer repair signal TRP<3> is at a logic high level. The fourth repair information signal RP<4> may be set as a signal which is enabled to a logic high level in the case where a failure occurs in the third bidirectional through electrode 24.

The fifth transfer control signal generation circuit 115 may be realized by, for example but not limited to, a NOR gate NOR19, an inverter IV22, and a NAND gate NAND17. The fifth transfer control signal generation circuit 115 may generate the fifth transfer control signal TCON<5> depending on the logic levels of a fifth repair information signal RP<5> and the fourth transfer repair signal TRP<4> by the ground voltage VSS. The fifth transfer control signal generation circuit 115 may generate the fifth transfer control signal TCON<5> which is enabled to a logic high level, in the case where the fifth repair information signal RP<5> is at a logic high level, by the ground voltage VSS of a logic low level. The fifth transfer control signal generation circuit 115 may generate the fifth transfer control signal TCON<5> which is enabled to a logic high level, in the case where the fourth transfer repair signal TRP<4> is at a logic high level. The fifth repair information signal RP<5> may be set as a signal which is enabled to a logic high level in the case where a failure occurs in the fourth bidirectional through electrode 25.

Figure 3:
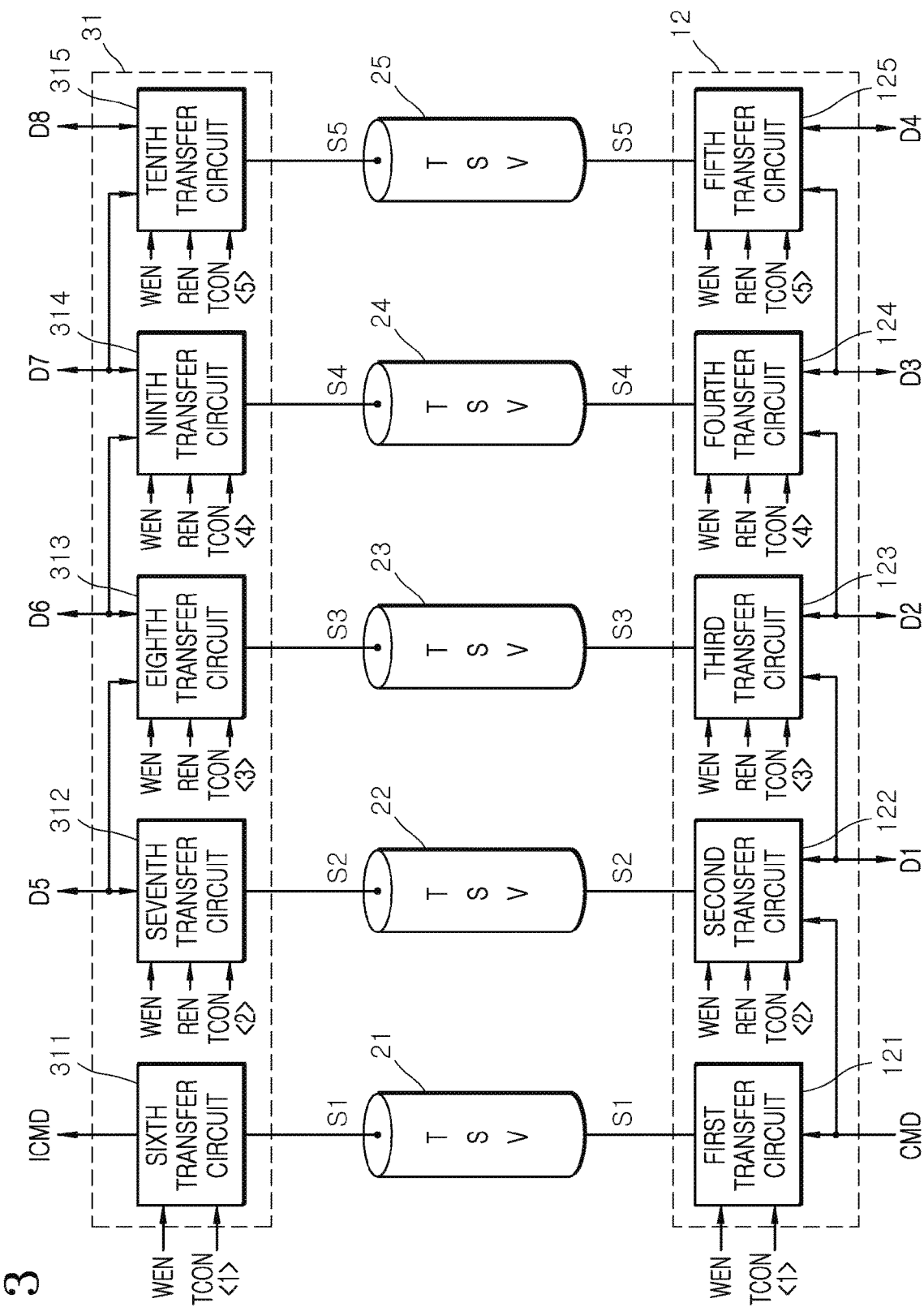
FIG. 3 is a representation of an example of a diagram to assist in the explanation of the coupling of through electrodes and first and second path control circuits illustrated in FIG. 1.

FIG. 3 is a representation of an example of a diagram to assist in the explanation of the coupling of the unidirectional through electrode 21, the first bidirectional through electrode 22, the second bidirectional through electrode 23, the third bidirectional through electrode 24 and the fourth bidirectional through electrode 25 with the first path control circuit 12 and the second path control circuit 31.

The first path control circuit 12 may include a first transfer circuit 121, a second transfer circuit 122, a third transfer circuit 123, a fourth transfer circuit 124, and a fifth transfer circuit 125.

The first transfer circuit 121 may be coupled to the unidirectional through electrode 21 and output the first signal S1. The first transfer circuit 121 may output a command CMD as the first signal S1 depending on the logic level of the first transfer control signal TCON<1> in the case where the write enable signal WEN is enabled. The first transfer circuit 121 may block the input of the command CMD depending on the logic level of the first transfer control signal TCON<1> in the case where the write enable signal WEN is enabled.

The second transfer circuit 122 may be coupled to the first bidirectional through electrode 22 and receive and output the second signal S2. The second transfer circuit 122 may generate the second signal S2 from first data D1 depending on the logic level of the second transfer control signal TCON<2> in the case where the write enable signal WEN is enabled. The second transfer circuit 122 may generate the second signal S2 from the command CMD depending on the logic level of the second transfer control signal TCON<2> in the case where the write enable signal WEN is enabled. The second transfer circuit 122 may generate first data D1 from the second signal S2 in the case where the read enable signal REN is enabled.

The third transfer circuit 123 may be coupled to the second bidirectional through electrode 23 and receive and output the third signal S3. The third transfer circuit 123 may generate the third signal S3 from the first data D1 depending on the logic level of the third transfer control signal TCON<3> in the case where the write enable signal WEN is enabled. The third transfer circuit 123 may generate the third signal S3 from second data D2 depending on the logic level of the third transfer control signal TCON<3> in the case where the write enable signal WEN is enabled. The third transfer circuit 123 may generate second data D2 from the third signal S3 in the case where the read enable signal REN is enabled.

The fourth transfer circuit 124 may be coupled to the third bidirectional through electrode 24 and receive and output the fourth signal S4. The fourth transfer circuit 124 may generate the fourth signal S4 from the second data D2 depending on the logic level of the fourth transfer control signal TCON<4> in the case where the write enable signal WEN is enabled. The fourth transfer circuit 124 may generate the fourth signal S4 from third data D3 depending on the logic level of the fourth transfer control signal TCON<4> in the case where the write enable signal WEN is enabled. The fourth transfer circuit 124 may generate third data D3 from the fourth signal S4 in the case where the read enable signal REN is enabled.

The fifth transfer circuit 125 may be coupled to the fourth bidirectional through electrode 25 and receive and output the fifth signal S5. The fifth transfer circuit 125 may generate the fifth signal S5 from the third data D3 depending on the logic level of the fifth transfer control signal TCON<5> in the case where the write enable signal WEN is enabled. The fifth transfer circuit 125 may generate the fifth signal S5 from fourth data D4 depending on the logic level of the fifth transfer control signal TCON<5> in the case where the write enable signal WEN is enabled. The fifth transfer circuit 125 may generate fourth data D4 from the fifth signal S5 in the case where the read enable signal REN is enabled.

The second path control circuit 31 may include a sixth transfer circuit 311, a seventh transfer circuit 312, an eighth transfer circuit 313, a ninth transfer circuit 314, and a tenth transfer circuit 315.

The sixth transfer circuit 311 may be coupled to the unidirectional through electrode 21 and receive the first signal S1. The sixth transfer circuit 311 may output the first signal S1 as an internal command ICMD depending on the logic level of the first transfer control signal TCON<1> in the case where the write enable signal WEN is enabled. The sixth transfer circuit 311 may block the input of the first signal S1 depending on the logic level of the first transfer control signal TCON<1> in the case where the write enable signal WEN is enabled.

The seventh transfer circuit 312 may be coupled to the first bidirectional through electrode 22 and receive and output the second signal S2. The seventh transfer circuit 312 may generate fifth data D5 from the second signal S2 in the case where the write enable signal WEN is enabled. The seventh transfer circuit 312 may generate the second signal S2 from fifth data D5 depending on the logic level of the second transfer control signal TCON<2> in the case where the read enable signal REN is enabled. The seventh transfer circuit 312 may block the input of the fifth data D5 depending on the logic level of the second transfer control signal TCON<2> in the case where the read enable signal REN is enabled.

The eighth transfer circuit 313 may be coupled to the second bidirectional through electrode 23 and receive and output the third signal S3. The eighth transfer circuit 313 may generate sixth data D6 from the third signal S3 in the case where the write enable signal WEN is enabled. The eighth transfer circuit 313 may generate the third signal S3 from the fifth data D5 depending on the logic level of the third transfer control signal TCON<3> in the case where the read enable signal REN is enabled. The eighth transfer circuit 313 may generate the third signal S3 from sixth data D6 depending on the logic level of the third transfer control signal TCON<3> in the case where the read enable signal REN is enabled.

The ninth transfer circuit 314 may be coupled to the third bidirectional through electrode 24 and receive and output the fourth signal S4. The ninth transfer circuit 314 may generate seventh data D7 from the fourth signal S4 in the case where the write enable signal WEN is enabled. The ninth transfer circuit 314 may generate the fourth signal S4 from the sixth data D6 depending on the logic level of the fourth transfer control signal TCON<4> in the case where the read enable signal REN is enabled. The ninth transfer circuit 314 may generate the fourth signal S4 from seventh data D7 depending on the logic level of the fourth transfer control signal TCON<4> in the case where the read enable signal REN is enabled.

The tenth transfer circuit 315 may be coupled to the fourth bidirectional through electrode 25 and receive and output the fifth signal S5. The tenth transfer circuit 315 may generate eighth data D8 from the fifth signal S5 in the case where the write enable signal WEN is enabled. The tenth transfer circuit 315 may generate the fifth signal S5 from the seventh data D7 depending on the logic level of the fifth transfer control signal TCON<5> in the case where the read enable signal REN is enabled. The tenth transfer circuit 315 may generate the fifth signal S5 from eighth data D8 depending on the logic level of the fifth transfer control signal TCON<5> in the case where the read enable signal REN is enabled.

Figure 4:
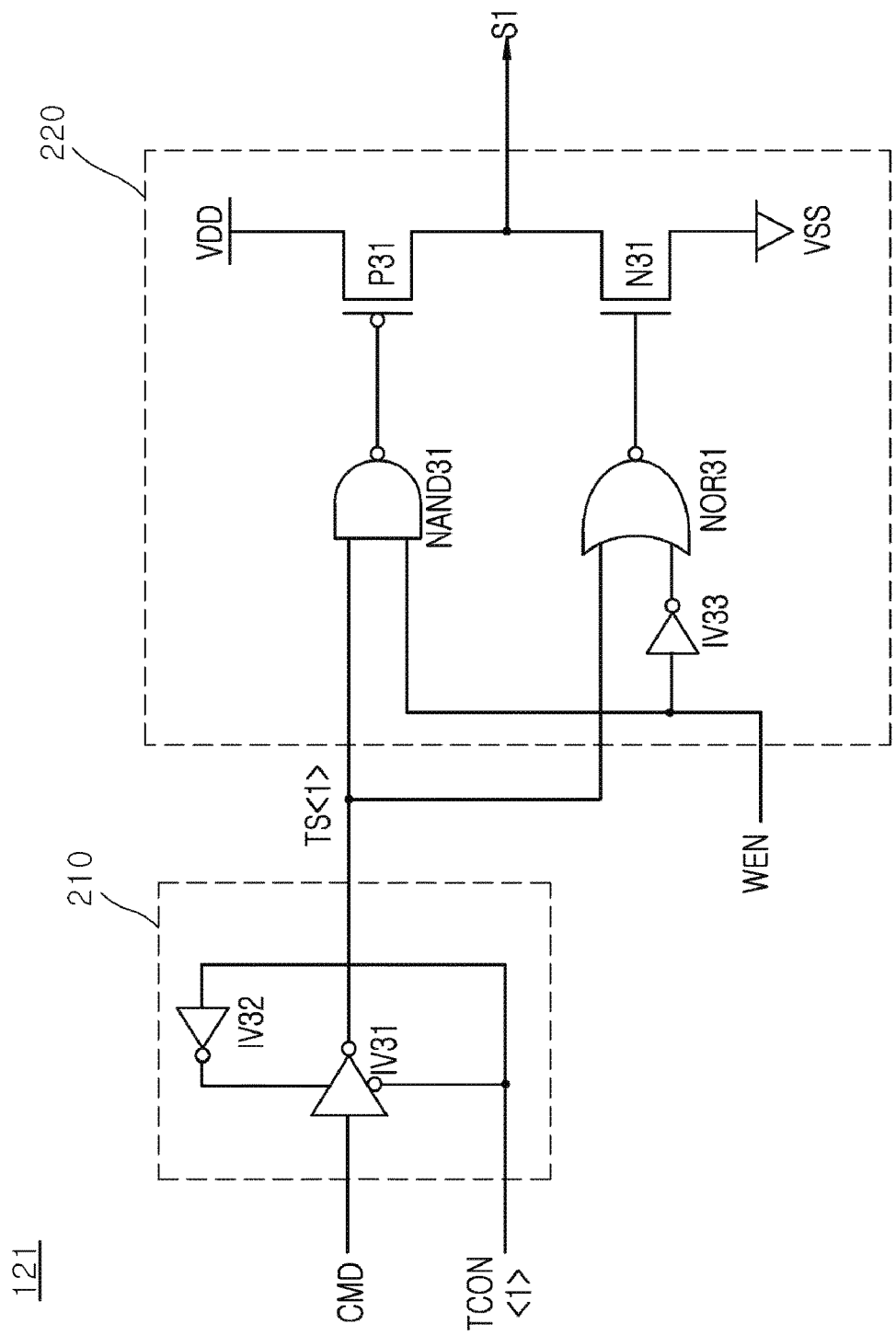
FIG. 4 is a circuit diagram illustrating a representation of an example of the configuration of a first transfer circuit included in the first path control circuit illustrated in FIG. 3.

Referring to FIG. 4, the first transfer circuit 121 may include a first buffer circuit 210 and a first driving circuit 220.

The first buffer circuit 210 may be realized by, for example but not limited to, inverters IV31 and IV32. The first buffer circuit 210 may generate a first transfer signal TS<1> by inverting and buffering the command CMD in the case where the first transfer control signal TCON<1> is disabled to a logic low level. The first buffer circuit 210 may block the input of the command CMD in the case where the first transfer control signal TCON<1> is enabled to a logic high level.

The first driving circuit 220 may be realized by, for example but not limited to, an inverter IV33, a NAND gate NAND31, a NOR gate NOR31, a PMOS transistor P31 and an NMOS transistor N31. The first driving circuit 220 may generate the first signal S1 depending on the logic level of the first transfer signal TS<1> in the case where the write enable signal WEN is enabled to a logic high level. The first driving circuit 220 may generate the first signal S1 of a logic high level by driving the first signal S1 to the level of a power supply voltage VDD in the case where the write enable signal WEN is enabled to a logic high level and the first transfer signal TS<1> is at a logic high level. The first driving circuit 220 may generate the first signal S1 of a logic low level by driving the first signal S1 to the level of the ground voltage VSS in the case where the write enable signal WEN is enabled to a logic high level and the first transfer signal TS<1> is at a logic low level.

Figure 5:
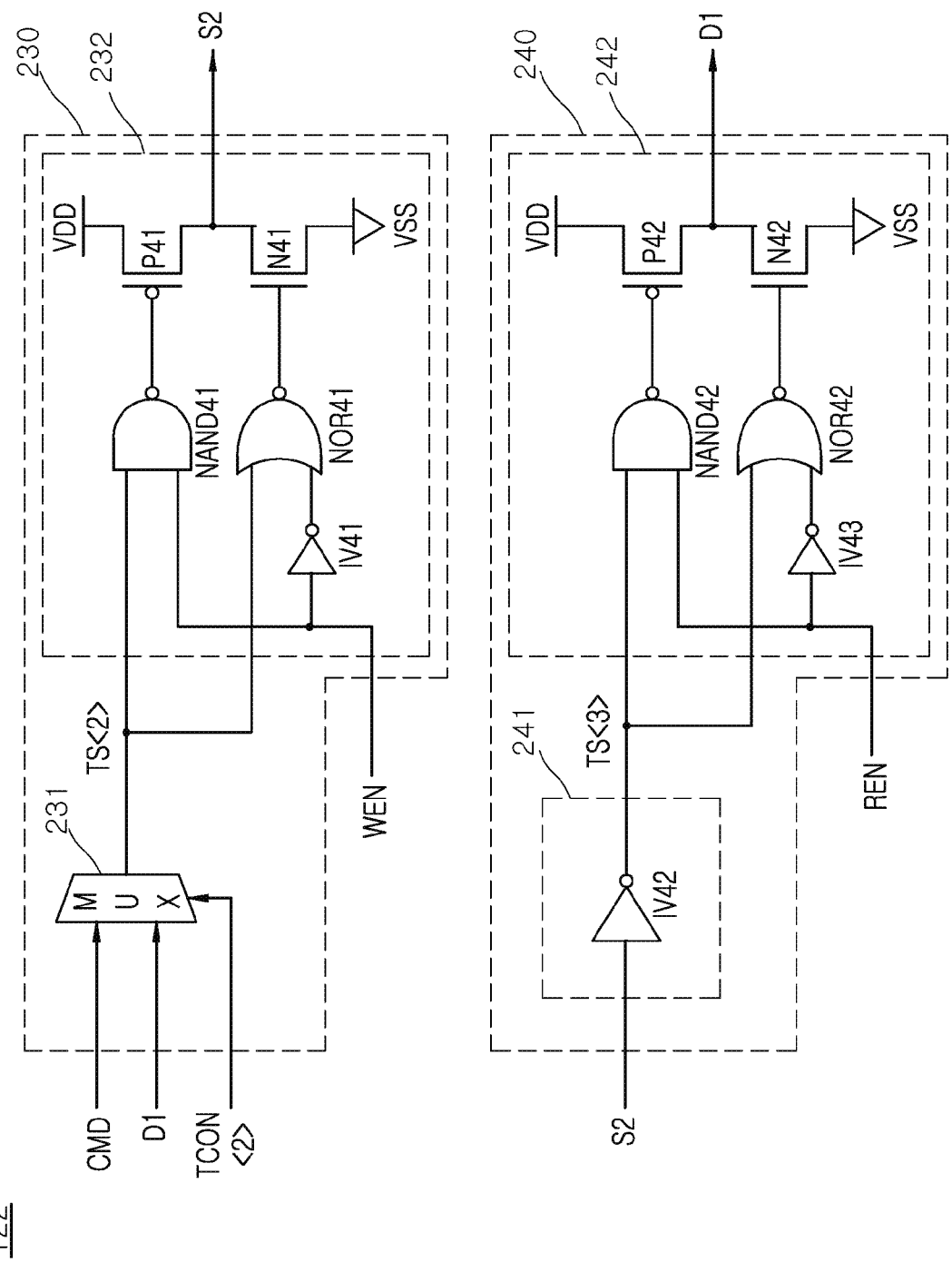
FIG. 5 is a circuit diagram illustrating a representation of an example of the configuration of a second transfer circuit included in the first path control circuit illustrated in FIG. 3.

Referring to FIG. 5, the second transfer circuit 122 may include a first write transfer circuit 230 and a first read transfer circuit 240.

The first write transfer circuit 230 may include a first selective transfer circuit 231 and a second driving circuit 232.

The first selective transfer circuit 231 may generate a second transfer signal TS<2> by inverting and buffering the command CMD in the case where the second transfer control signal TCON<2> is enabled to a logic high level. The first selective transfer circuit 231 may generate the second transfer signal TS<2> by inverting and buffering the first data D1 in the case where the second transfer control signal TCON<2> is disabled to a logic low level.

The second driving circuit 232 may be realized by, for example but not limited to, an inverter IV41, a NAND gate NAND41, a NOR gate NOR41, a PMOS transistor P41 and an NMOS transistor N41. The second driving circuit 232 may generate the second signal S2 depending on the logic level of the second transfer signal TS<2> in the case where the write enable signal WEN is enabled to a logic high level. The second driving circuit 232 may generate the second signal S2 of a logic high level by driving the second signal S2 to the level of the power supply voltage VDD in the case where the write enable signal WEN is enabled to a logic high level and the second transfer signal TS<2> is at a logic high level. The second driving circuit 232 may generate the second signal S2 of a logic low level by driving the second signal S2 to the level of the ground voltage VSS in the case where the write enable signal WEN is enabled to a logic high level and the second transfer signal TS<2> is at a logic low level.

The first read transfer circuit 240 may include a second buffer circuit 241 and a third driving circuit 242.

The second buffer circuit 241 may be realized by, for example but not limited to, an inverter IV42. The second buffer circuit 241 may generate a third transfer signal TS<3> by inverting and buffering the second signal S2.

The third driving circuit 242 may be realized by, for example but not limited to, an inverter IV43, a NAND gate NAND42, a NOR gate NOR42, a PMOS transistor P42 and an NMOS transistor N42. The third driving circuit 242 may generate the first data D1 depending on the logic level of the third transfer signal TS<3> in the case where the read enable signal REN is enabled to a logic high level. The third driving circuit 242 may generate the first data D1 of a logic high level by driving the first data D1 to the level of the power supply voltage VDD in the case where the read enable signal REN is enabled to a logic high level and the third transfer signal TS<3> is at a logic high level. The third driving circuit 242 may generate the first data D1 of a logic low level by driving the first data D1 to the level of the ground voltage VSS in the case where the read enable signal REN is enabled to a logic high level and the third transfer signal TS<3> is at a logic low level.

Because the third to fifth transfer circuits 123 to 125 illustrated in FIG. 3 are realized by the same circuit and perform the same operation as the second transfer circuit 122 illustrated in FIG. 5 except that signals inputted thereto and outputted therefrom are different, descriptions thereof will be omitted.

Figure 6:
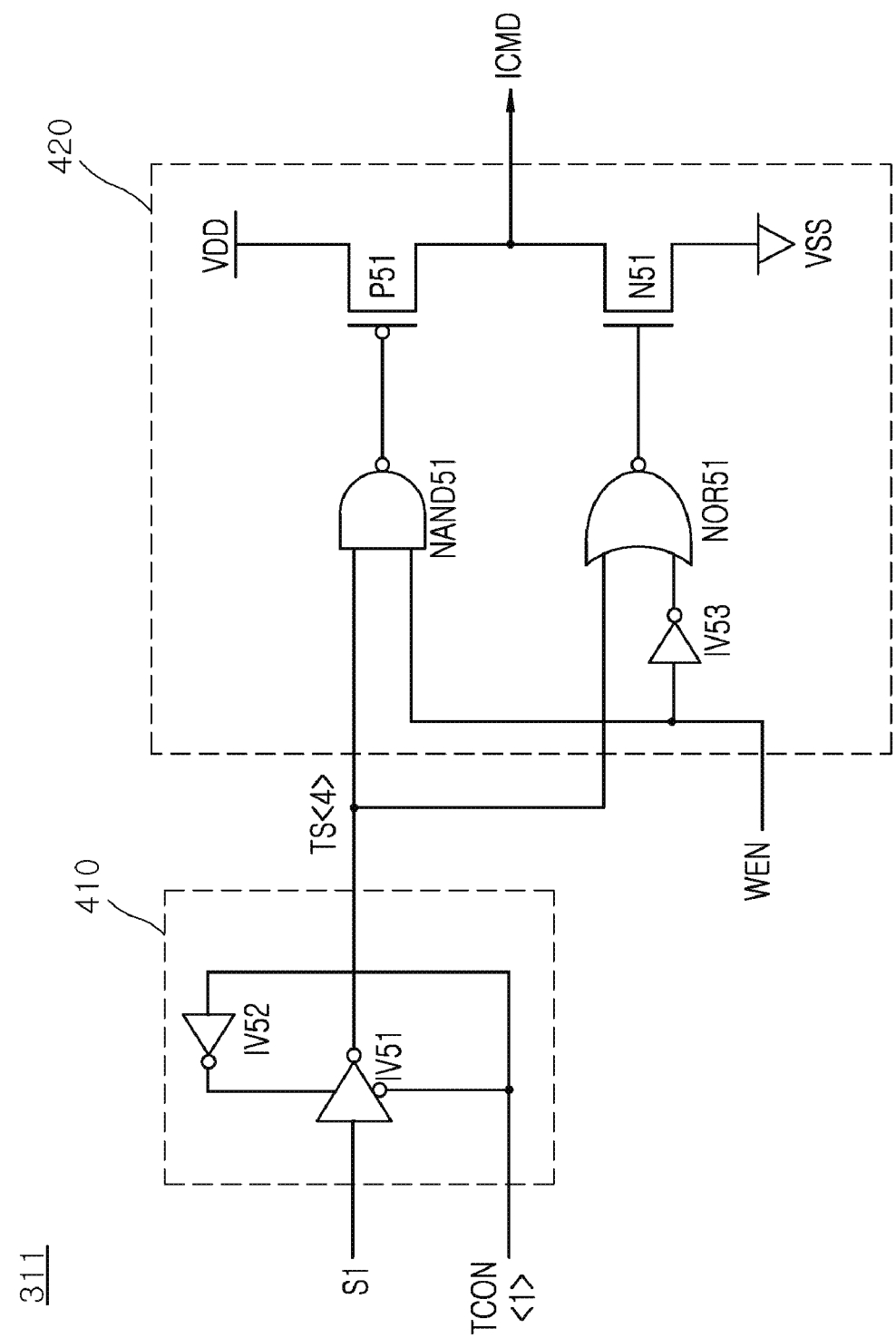
FIG. 6 is a circuit diagram illustrating a representation of an example of the configuration of a sixth transfer circuit included in the second path control circuit illustrated in FIG. 3.

Referring to FIG. 6, the sixth transfer circuit 311 may include a third buffer circuit 410 and a fourth driving circuit 420.

The third buffer circuit 410 may be realized by, for example but not limited to, inverters IV51 and IV52. The third buffer circuit 410 may generate a fourth transfer signal TS<4> by inverting and buffering the first signal S1 in the case where the first transfer control signal TCON<1> is disabled to a logic low level. The third buffer circuit 410 may block the input of the first signal S1 in the case where the first transfer control signal TCON<1> is enabled to a logic high level.

The fourth driving circuit 420 may be realized by, for example but not limited to, an inverter IV53, a NAND gate NAND51, a NOR gate NOR51, a PMOS transistor P51 and an NMOS transistor N51. The fourth driving circuit 420 may generate the internal command ICMD depending on the logic level of the fourth transfer signal TS<4> in the case where the write enable signal WEN is enabled to a logic high level. The fourth driving circuit 420 may generate the internal command ICMD of a logic high level by driving the internal command ICMD to the level of the power supply voltage VDD in the case where the write enable signal WEN is enabled to a logic high level and the fourth transfer signal TS<4> is at a logic high level. The fourth driving circuit 420 may generate the internal command ICMD of a logic low level by driving the internal command ICMD to the level of the ground voltage VSS in the case where the write enable signal WEN is enabled to a logic high level and the fourth transfer signal TS<4> is at a logic low level.

Figure 7:
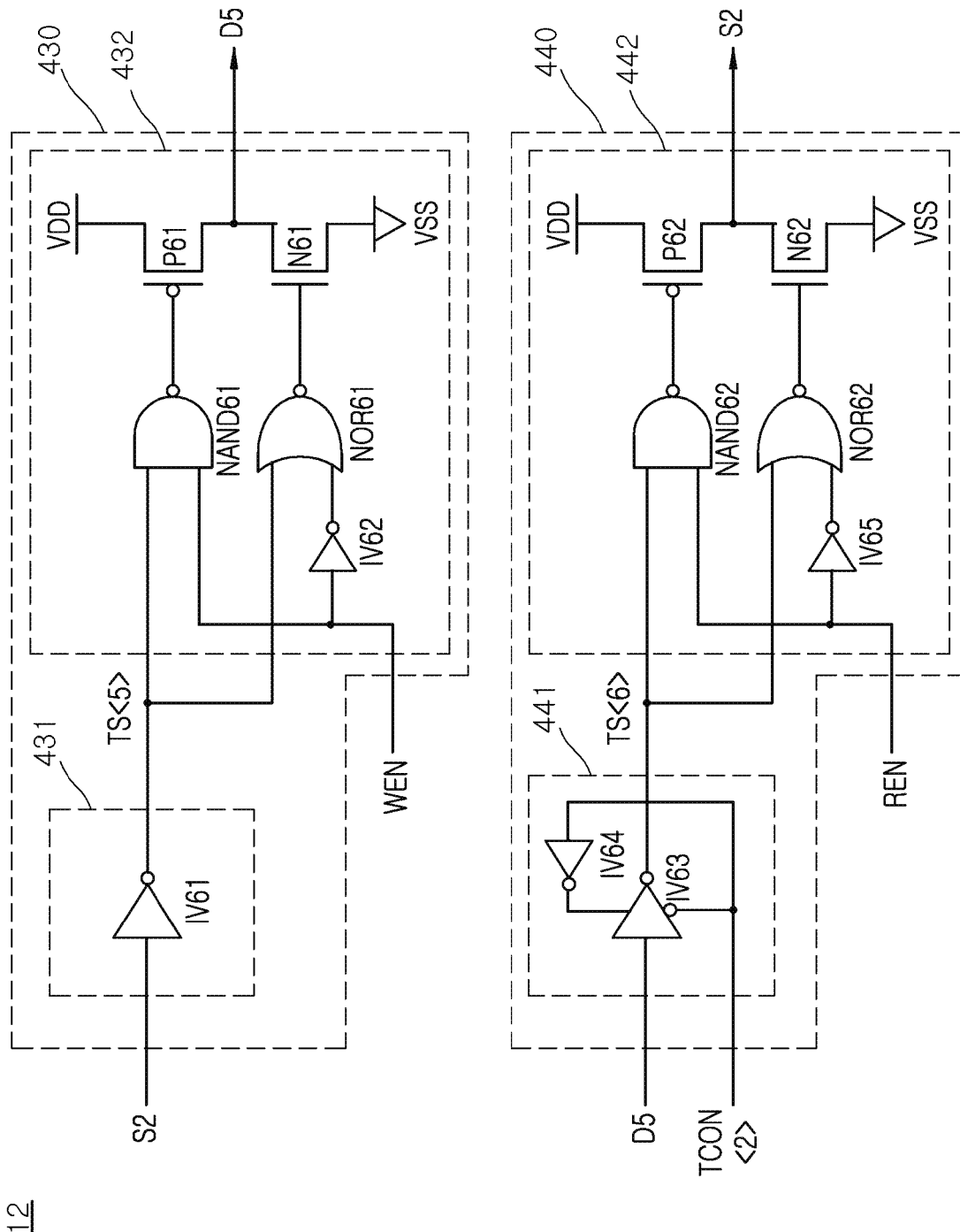
FIG. 7 is a circuit diagram illustrating a representation of an example of the configuration of a seventh transfer circuit included in the second path control circuit illustrated in FIG. 3.

Referring to FIG. 7, the seventh transfer circuit 312 may include a second write transfer circuit 430 and a second read transfer circuit 440.

The second write transfer circuit 430 may include a fourth buffer circuit 431 and a fifth driving circuit 432.

The fourth buffer circuit 431 may be realized by, for example, an inverter IV61. The fourth buffer circuit 431 may generate a fifth transfer signal TS<5> by inverting and buffering the second signal S2.

The fifth driving circuit 432 may be realized by, for example but not limited to, an inverter IV62, a NAND gate NAND61, a NOR gate NOR61, a PMOS transistor P61 and an NMOS transistor N61.

The fifth driving circuit 432 may generate the fifth data D5 depending on the logic level of the fifth transfer signal TS<5> in the case where the write enable signal WEN is enabled to a logic high level. The fifth driving circuit 432 may generate the fifth data D5 of a logic high level by driving the fifth data D5 to the level of the power supply voltage VDD in the case where the write enable signal WEN is enabled to a logic high level and the fifth transfer signal TS<5> is at a logic high level. The fifth driving circuit 432 may generate the fifth data D5 of a logic low level by driving the fifth data D5 to the level of the ground voltage VSS in the case where the write enable signal WEN is enabled to a logic high level and the fifth transfer signal TS<5> is at a logic low level.

The second read transfer circuit 440 may include a fifth buffer circuit 441 and a sixth driving circuit 442.

The fifth buffer circuit 441 may be realized by, for example but not limited to, inverters IV63 and IV64. The fifth buffer circuit 441 may generate a sixth transfer signal TS<6> by inverting and buffering the fifth data D5 in the case where the second transfer control signal TCON<2> is disabled to a logic low level. The fifth buffer circuit 441 may block the input of the fifth data D5 in the case where the second transfer control signal TCON<2> is enabled to a logic high level.

The sixth driving circuit 442 may be realized by, for example but not limited to, an inverter IV65, a NAND gate NAND62, a NOR gate NOR62, a PMOS transistor P62 and an NMOS transistor N62. The sixth driving circuit 442 may generate the second signal S2 depending on the logic level of the sixth transfer signal TS<6> in the case where the read enable signal REN is enabled to a logic high level. The sixth driving circuit 442 may generate the second signal S2 of a logic high level by driving the second signal S2 to the level of the power supply voltage VDD in the case where the read enable signal REN is enabled to a logic high level and the sixth transfer signal TS<6> is at a logic high level. The sixth driving circuit 442 may generate the second signal S2 of a logic low level by driving the second signal S2 to the level of the ground voltage VSS in the case where the read enable signal REN is enabled to a logic high level and the sixth transfer signal TS<6> is at a logic low level.

Figure 8:
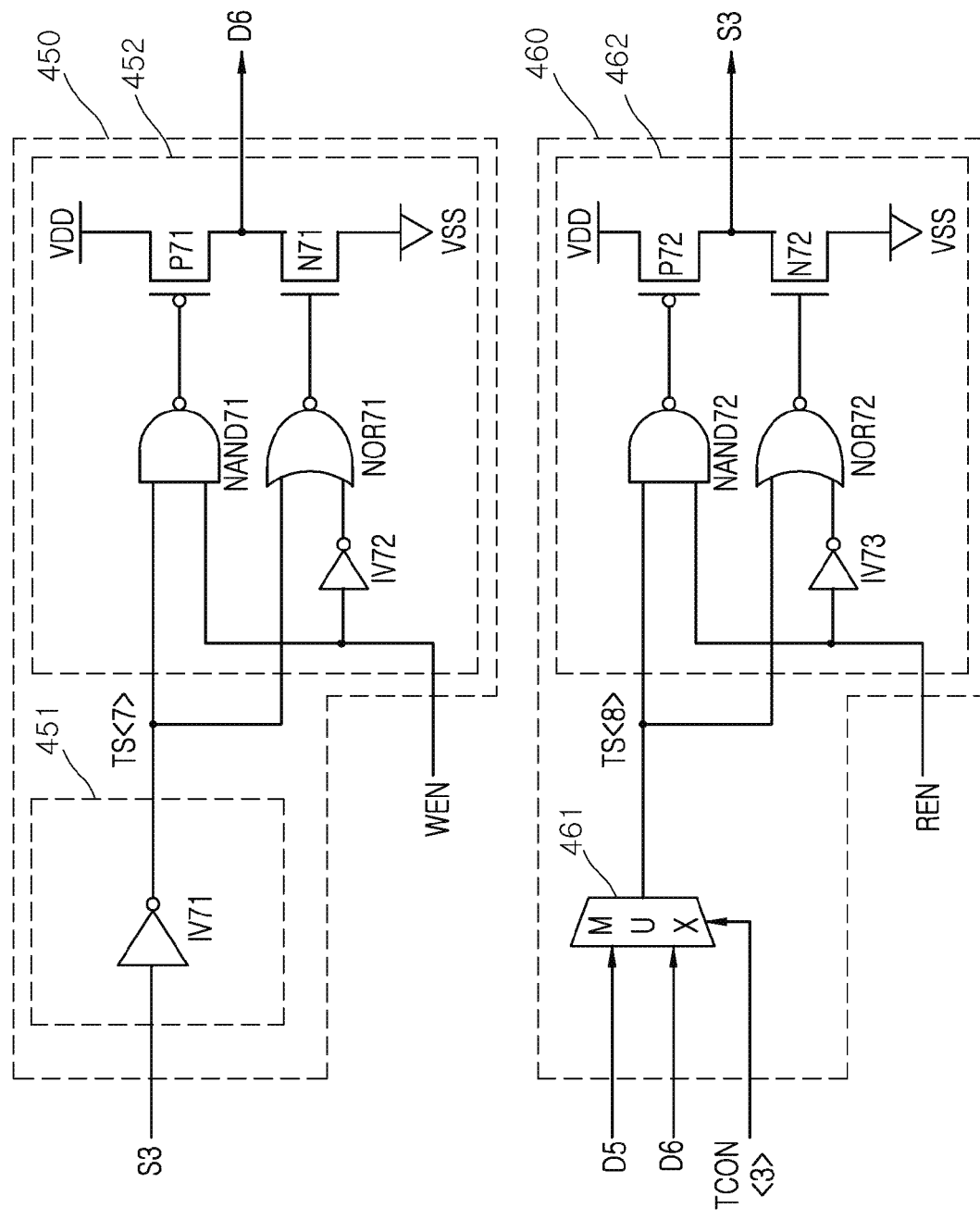
FIG. 8 is a circuit diagram illustrating a representation of an example of the configuration of an eighth transfer circuit included in the second path control circuit illustrated in FIG. 3.

Referring to FIG. 8, the eighth transfer circuit 313 may include a third write transfer circuit 450 and a third read transfer circuit 460.

The third write transfer circuit 450 may include a sixth buffer circuit 451 and a seventh driving circuit 452.

The sixth buffer circuit 451 may be realized by, for example but not limited to, an inverter IV71. The sixth buffer circuit 451 may generate a seventh transfer signal TS<7> by inverting and buffering the third signal S3.

The seventh driving circuit 452 may be realized by, for example but not limited to, an inverter IV72, a NAND gate NAND71, a NOR gate NOR71, a PMOS transistor P71 and an NMOS transistor N71. The seventh driving circuit 452 may generate the sixth data D6 depending on the logic level of the seventh transfer signal TS<7> in the case where the write enable signal WEN is enabled to a logic high level. The seventh driving circuit 452 may generate the sixth data D6 of a logic high level by driving the sixth data D6 to the level of the power supply voltage VDD in the case where the write enable signal WEN is enabled to a logic high level and the seventh transfer signal TS<7> is at a logic high level. The seventh driving circuit 452 may generate the sixth data D6 of a logic low level by driving the sixth data D6 to the level of the ground voltage VSS in the case where the write enable signal WEN is enabled to a logic high level and the seventh transfer signal TS<7> is at a logic low level.

The third read transfer circuit 460 may include a second selective transfer circuit 461 and an eighth driving circuit 462.

The second selective transfer circuit 461 may generate an eighth transfer signal TS<8> by inverting and buffering the fifth data D5 in the case where the third transfer control signal TCON<3> is enabled to a logic high level. The second selective transfer circuit 461 may generate the eighth transfer signal TS<8> by inverting and buffering the sixth data D6 in the case where the third transfer control signal TCON<3> is disabled to a logic low level.

The eighth driving circuit 462 may be realized by, for example but not limited to, an inverter IV73, a NAND gate NAND72, a NOR gate NOR72, a PMOS transistor P72 and an NMOS transistor N72. The eighth driving circuit 462 may generate the third signal S3 depending on the logic level of the eighth transfer signal TS<8> in the case where the read enable signal REN is enabled to a logic high level. The eighth driving circuit 462 may generate the third signal S3 of a logic high level by driving the third signal S3 to the level of the power supply voltage VDD in the case where the read enable signal REN is enabled to a logic high level and the eighth transfer signal TS<8> is at a logic high level. The eighth driving circuit 462 may generate the third signal S3 of a logic low level by driving the third signal S3 to the level of the ground voltage VSS in the case where the read enable signal REN is enabled to a logic high level and the eighth transfer signal TS<8> is at a logic low level.

Because the ninth and tenth transfer circuits 314 and 315 illustrated in FIG. 3 are realized by the same circuit and perform the same operation as the eighth transfer circuit 313 illustrated in FIG. 8 except that signals inputted thereto and outputted therefrom are different, descriptions thereof will be omitted.

A repair operation in a write operation of the semiconductor chip 1 according to an embodiment will be described below as an example with reference to FIGS. 1 to 8, by being divided into a case where a failure has occurred in the unidirectional through electrode 21 and a case where a failure has occurred in the first bidirectional through electrode 22.

First, a repair operation in the case where a failure has occurred in the unidirectional through electrode 21 during a write operation will be described below.

The repair control circuit 11 generates the write enable signal WEN which is enabled in a write operation. The repair control circuit 11 generates the first to fifth transfer control signals TCON<1:5> in the write operation. Because a failure has occurred in the unidirectional through electrode 21, all the first to fifth transfer control signals TCON<1:5> are enabled to logic high levels. In this way, the first to fifth transfer control signals TCON<1:5> include failure information on the unidirectional through electrode 21 and the first to fourth bidirectional through electrodes 22-25 because having all the first to fifth transfer control signals TCON<1:5> enabled to the logic high level indicates that the unidirectional through electrode 21 has failed. Thus, in some embodiments, which through electrode (i.e., 21, 22, 23, 24, and 25) has failed is indicated by the logic level combination of all the transfer control signals (i.e., TCON<1:5>). In other embodiments, which through electrode (i.e., 21, 22, 23, 24, and 25) has failed is indicated by a logic level of at least one of the transfer control signals.

The first transfer circuit 121 blocks the input of the command CMD because the write enable signal WEN is enabled to a logic high level and the first transfer control signal TCON<1> is enabled to a logic high level. Because a failure has occurred in the unidirectional through electrode 21, the first signal S1 is not transferred.

The second transfer circuit 122 generates the second signal S2 from the command CMD because the write enable signal WEN is enabled to a logic high level and the second transfer control signal TCON<2> is enabled to a logic high level. The second transfer circuit 122 outputs the second signal S2 by being coupled to the first bidirectional through electrode 22.

The third transfer circuit 123 generates the third signal S3 from the first data D1 because the write enable signal WEN is enabled to a logic high level and the third transfer control signal TCON<3> is enabled to a logic high level. The third transfer circuit 123 outputs the third signal S3 by being coupled to the second bidirectional through electrode 23.

The fourth transfer circuit 124 generates the fourth signal S4 from the second data D2 because the write enable signal WEN is enabled to a logic high level and the fourth transfer control signal TCON<4> is enabled to a logic high level. The fourth transfer circuit 124 outputs the fourth signal S4 by being coupled to the third bidirectional through electrode 24.

The fifth transfer circuit 125 generates the fifth signal S5 from the third data D3 because the write enable signal WEN is enabled to a logic high level and the fifth transfer control signal TCON<5> is enabled to a logic high level. The fifth transfer circuit 125 outputs the fifth signal S5 by being coupled to the fourth bidirectional through electrode 25.

The sixth transfer circuit 311 generates the internal command ICMD from the first signal S1 in the case where the write enable signal WEN is enabled to a logic high level. However, because a failure has occurred in the unidirectional through electrode 21, the first signal S1 is not transferred, and as a result, the sixth transfer circuit 311 does not generate the internal command ICMD.

The seventh transfer circuit 312 generates the fifth data D5 from the second signal S2 because the write enable signal WEN is enabled to a logic high level. The seventh transfer circuit 312 receives the second signal S2 by being coupled to the first bidirectional through electrode 22. In this case, the fifth data D5 is generated from the command CMD. That is to say, the fifth data D5 is used as an internal command ICMD.

The eighth transfer circuit 313 generates the sixth data D6 from the third signal S3 because the write enable signal WEN is enabled to a logic high level. The eighth transfer circuit 313 receives the third signal S3 by being coupled to the second bidirectional through electrode 23. In this case, the sixth data D6 is generated from the first data D1.

The ninth transfer circuit 314 generates the seventh data D7 from the fourth signal S4 because the write enable signal WEN is enabled to a logic high level. The ninth transfer circuit 314 receives the fourth signal S4 by being coupled to the third bidirectional through electrode 24. In this case, the seventh data D7 is generated from the second data D2.

The tenth transfer circuit 315 generates the eighth data D8 from the fifth signal S5 because the write enable signal WEN is enabled to a logic high level. The tenth transfer circuit 315 receives the fifth signal S5 by being coupled to the fourth bidirectional through electrode 25. In this case, the eighth data D8 is generated from the third data D3.

Next, a repair operation in the case where a failure has occurred in the first bidirectional through electrode 22 during a write operation will be described below.

The repair control circuit 11 generates the write enable signal WEN which is enabled in a write operation. The repair control circuit 11 generates the first to fifth transfer control signals TCON<1:5> in the write operation. Because a failure has occurred in the first bidirectional through electrode 22, among the first to fifth transfer control signals TCON<1:5>, the first transfer control signal TCON<1> is disabled to a logic low level, and all the second to fifth transfer control signals TCON<2:5> are enabled to logic high levels. In this way, the first to fifth transfer control signals TCON<1:5> include failure information on the unidirectional through electrode 21 and the first to fourth bidirectional through electrodes 22-25 because having the first transfer control signal TCON<1> disabled to the logic low level, and all of the second to fifth transfer control signals TCON<2:5> enabled to the logic high level indicates that the first bidirectional through electrode 22 has failed. For example, when the first and second transfer control signals TCON<1:2> are disabled to a logic low level, and the third to fifth transfer control signals TCON<3:5> are enabled to the logic high level indicates that the second bidirectional through electrode 23 has failed. Thus, in some embodiments, which through electrode (i.e., 21, 22, 23, 24, and 25) has failed is indicated by the logic level combination of all the transfer control signals (i.e., TCON<1:5>). In other embodiments, which through electrode (i.e., 21, 22, 23, 24, and 25) has failed is indicated by a logic level of at least one of the transfer control signals.

The first transfer circuit 121 generates the first signal S1 from the command CMD because the write enable signal WEN is enabled to a logic high level and the first transfer control signal TCON<1> is disabled to a logic low level. The first transfer circuit 121 outputs the first signal S1 by being coupled to the unidirectional through electrode 21.

The second transfer circuit 122 generates the second signal S2 from the command CMD because the write enable signal WEN is enabled to a logic high level and the second transfer control signal TCON<2> is enabled to a logic high level. The second transfer circuit 122 outputs the second signal S2 by being coupled to the first bidirectional through electrode 22. Because a failure has occurred in the first bidirectional through electrode 22, the second signal S2 is not transferred.

The third transfer circuit 123 generates the third signal S3 from the first data D1 because the write enable signal WEN is enabled to a logic high level and the third transfer control signal TCON<3> is enabled to a logic high level. The third transfer circuit 123 outputs the third signal S3 by being coupled to the second bidirectional through electrode 23.

The fourth transfer circuit 124 generates the fourth signal S4 from the second data D2 because the write enable signal WEN is enabled to a logic high level and the fourth transfer control signal TCON<4> is enabled to a logic high level. The fourth transfer circuit 124 outputs the fourth signal S4 by being coupled to the third bidirectional through electrode 24.

The fifth transfer circuit 125 generates the fifth signal S5 from the third data D3 because the write enable signal WEN is enabled to a logic high level and the fifth transfer control signal TCON<5> is enabled to a logic high level. The fifth transfer circuit 125 outputs the fifth signal S5 by being coupled to the fourth bidirectional through electrode 25.

The sixth transfer circuit 311 generates the internal command ICMD from the first signal S1 because the write enable signal WEN is enabled to a logic high level and the first transfer control signal TCON<1> is disabled to a logic low level. The sixth transfer circuit 311 receives the first signal S1 by being coupled to the unidirectional through electrode 21.

The seventh transfer circuit 312 generates the fifth data D5 from the second signal S2 in the case where the write enable signal WEN is enabled to a logic high level. However, because a failure has occurred in the first bidirectional through electrode 22, the second signal S2 is not transferred, and as a result, the seventh transfer circuit 312 does not generate the fifth data D5.

The eighth transfer circuit 313 generates the sixth data D6 from the third signal S3 because the write enable signal WEN is enabled to a logic high level. The eighth transfer circuit 313 receives the third signal S3 by being coupled to the second bidirectional through electrode 23. In this case, the sixth data D6 is generated from the first data D1.

The ninth transfer circuit 314 generates the seventh data D7 from the fourth signal S4 because the write enable signal WEN is enabled to a logic high level. The ninth transfer circuit 314 receives the fourth signal S4 by being coupled to the third bidirectional through electrode 24. In this case, the seventh data D7 is generated from the second data D2.

The tenth transfer circuit 315 generates the eighth data D8 from the fifth signal S5 because the write enable signal WEN is enabled to a logic high level. The tenth transfer circuit 315 receives the fifth signal S5 by being coupled to the fourth bidirectional through electrode 25. In this case, the eighth data D8 is generated from the third data D3.

As is apparent form the above descriptions, in the semiconductor chip according to an embodiment, by replacing a unidirectional through electrode with a bidirectional through electrode and replacing a bidirectional through electrode with another bidirectional through electrode in a repair operation during a write operation and a read operation, it may be possible to increase efficiency for repairing a semiconductor chip in which a through electrode has failed.

While various embodiments have been described above, it will be understood to those skilled in the art that the embodiments described are by way of example only. Accordingly, the semiconductor chips described herein should not be limited based on the described embodiments.

What is claimed is:

1. A semiconductor chip comprising:
   a first semiconductor device stacked with a second semiconductor device, the first semiconductor device coupled to the second semiconductor device through a unidirectional through electrode and a plurality of bidirectional through electrodes,
   wherein a repair operation for a through electrode in which a failure has occurred among the unidirectional through electrode and the plurality of bidirectional through electrodes is based on a plurality of transfer control signals, at least one of the transfer control signals includes failure information indicating the through electrode in which the failure has occurred,
   wherein, when a failure has occurred in the unidirectional through electrode, the unidirectional through electrode is replaced with any one of the plurality of bidirectional through electrodes which is disposed adjacent to the unidirectional through electrode.

2. The semiconductor chip according to claim 1, wherein a through electrode in which a failure has occurred, among the plurality of bidirectional through electrodes, is replaced with any one of bidirectional through electrodes which are disposed adjacent to the through electrode and in which a failure has not occurred.

3. The semiconductor chip according to claim 1, wherein the first semiconductor device comprises:
  a repair control circuit configured to generate a write enable signal which is enabled in a write operation and a read enable signal which is enabled in a read operation, and generate the plurality of transfer control signals in the write operation and the read operation; and
  a first path control circuit configured to receive and output a plurality of signals by replacing a path of a through electrode in which a failure has occurred among the unidirectional through electrode and the plurality of bidirectional through electrodes, with an adjacent through electrode, based on the plurality of transfer control signals, when the write enable signal and the read enable signal are enabled.

4. The semiconductor chip according to claim 3, wherein the repair control circuit comprises:
  an enable signal generation circuit configured to generate the write enable signal and the read enable signal which are selectively enabled depending on logic levels of a write start signal and a slice signal; and
  a transfer control signal generation circuit configured to generate the plurality of transfer control signals from a ground voltage and a plurality of repair information signals including failure information on the unidirectional through electrode and the plurality of bidirectional through electrodes.

5. The semiconductor chip according to claim 3, wherein the first path control circuit comprises:
  a plurality of transfer circuits coupled to the unidirectional through electrode and the plurality of bidirectional through electrodes, and configured to output a plurality of data as the plurality of signals by replacing a path of a through electrode in which a failure has occurred among the unidirectional through electrode and the plurality of bidirectional through electrodes, with an adjacent through electrode, based on the plurality of transfer control signals, when the write enable signal is enabled, and output the plurality of signals as the plurality of data when the read enable signal is enabled.

6. The semiconductor chip according to claim 1, wherein the second semiconductor device comprises:
  a second path control circuit configured to receive and output a plurality of signals by replacing a path of a through electrode in which a failure has occurred among the unidirectional through electrode and the plurality of bidirectional through electrodes, with an adjacent through electrode, based on the plurality of transfer control signals, in the write operation and the read operation.

7. The semiconductor chip according to claim 6, wherein the second path control circuit comprises:
  a plurality of transfer circuits coupled to the unidirectional through electrode and the plurality of bidirectional through electrodes, and configured to output the plurality of signals as a plurality of data by replacing a path of a through electrode in which a failure has occurred among the unidirectional through electrode and the plurality of bidirectional through electrodes, with an adjacent through electrode, based on the plurality of transfer control signals, when the write enable signal is enabled, and output the plurality of data as the plurality of signals when the read enable signal is enabled.

8. A semiconductor chip comprising:
  a first semiconductor device coupled to a unidirectional through electrode and first to fourth bidirectional through electrodes,
  wherein a repair operation for a through electrode in which a failure has occurred among the unidirectional through electrode and the first to fourth bidirectional through electrodes is based on first to fifth transfer control signals, at least one of the transfer control signal includes failure information indicating which through electrode has failed from the unidirectional through electrode and the first to fourth bidirectional through electrodes,
  wherein, when a failure has occurred in the unidirectional through electrode, the unidirectional through electrode is replaced with the first bidirectional through electrode.

9. The semiconductor chip according to claim 8, wherein the first bidirectional through electrode is replaced with the second bidirectional through electrode when a failure has occurred with the first bidirectional through electrode, the second bidirectional through electrode is replaced with the third bidirectional through electrode when a failure has occurred with the second bidirectional through electrode, and the third bidirectional through electrode is replaced with the fourth bidirectional through electrode when a failure has occurred with the third bidirectional through electrode.

10. The semiconductor chip according to claim 8, wherein the first semiconductor device comprises:
  a repair control circuit configured to generate a write enable signal which is enabled in a write operation and a read enable signal which is enabled in a read operation, and generate the first to fifth transfer control signals in the write operation and the read operation; and
  a first path control circuit configured to receive and output first to fifth signals by replacing a path of a through electrode in which a failure has occurred among the unidirectional through electrode and the first to fourth bidirectional through electrodes, with an adjacent through electrode, based on the first to fifth transfer control signals, when the write enable signal and the read enable signal are enabled.

11. The semiconductor chip according to claim 10, wherein the repair control circuit comprises:
  an enable signal generation circuit configured to generate the write enable signal and the read enable signal which are selectively enabled depending on logic levels of a write start signal and a slice signal; and
  a transfer control signal generation circuit configured to generate the first to fifth transfer control signals from a ground voltage and first to fifth repair information signals including failure information on the unidirectional through electrode and the first to fourth bidirectional through electrodes.

12. The semiconductor chip according to claim 11, wherein the transfer control signal generation circuit comprises:
  a first transfer control signal generation circuit configured to generate the first transfer control signal and a first transfer repair signal depending on a logic level of the first repair information signal which is enabled when a failure occurs in the unidirectional through electrode, by the ground voltage;

a second transfer control signal generation circuit configured to generate the second transfer control signal depending on logic levels of the second repair information signal which is enabled when a failure occurs in the first bidirectional through electrode and the first transfer repair signal, by the ground voltage, and generate a second transfer repair signal depending on logic levels of the first transfer repair signal and the second repair information signal;

a third transfer control signal generation circuit configured to generate the third transfer control signal depending on logic levels of the third repair information signal which is enabled when a failure occurs in the second bidirectional through electrode and the second transfer repair signal, by the ground voltage, and generate a third transfer repair signal depending on logic levels of the second transfer repair signal and the third repair information signal;

a fourth transfer control signal generation circuit configured to generate the fourth transfer control signal depending on logic levels of the fourth repair information signal which is enabled when a failure occurs in the third bidirectional through electrode and the third transfer repair signal, by the ground voltage, and generate a fourth transfer repair signal depending on logic levels of the third transfer repair signal and the fourth repair information signal; and a fifth transfer control signal generation circuit configured to generate the fifth transfer control signal depending on logic levels of the fifth repair information signal which is enabled when a failure occurs in the fourth bidirectional through electrode and the fourth transfer repair signal, by the ground voltage.

13. The semiconductor chip according to claim 10, wherein the first path control circuit comprises:

a first transfer circuit configured to output a command as the first signal or block input of the command depending on a logic level of the first transfer control signal when the write enable signal is enabled;

a second transfer circuit configured to generate the second signal from the command or generate the second signal from first data depending on a logic level of the second transfer control signal when the write enable signal is enabled, and generate the first data from the second signal when the read enable signal is enabled;

a third transfer circuit configured to generate the third signal from the first data or generate the third signal from second data depending on a logic level of the third transfer control signal when the write enable signal is enabled, and generate the second data from the third signal when the read enable signal is enabled;

a fourth transfer circuit configured to generate the fourth signal from the second data or generate the fourth signal from third data depending on a logic level of the fourth transfer control signal when the write enable signal is enabled, and generate the third data from the fourth signal when the read enable signal is enabled; and a fifth transfer circuit configured to generate the fifth signal from the third data or generate the fifth signal from fourth data depending on a logic level of the fifth transfer control signal when the write enable signal is enabled, and generate the fourth data from the fifth signal when the read enable signal is enabled.

14. The semiconductor chip according to claim 13, wherein the first transfer circuit outputs the first signal by being coupled to the unidirectional through electrode, the second transfer circuit receives and outputs the second signal by being coupled to the first bidirectional through electrode, the third transfer circuit receives and outputs the third signal by being coupled to the second bidirectional through electrode, the fourth transfer circuit receives and outputs the fourth signal by being coupled to the third bidirectional through electrode, and the fifth transfer circuit receives and outputs the fifth signal by being coupled to the fourth bidirectional through electrode.

15. The semiconductor chip according to claim 8, further comprising:

a second semiconductor device coupled to the unidirectional through electrode and the first to fourth bidirectional through electrodes, wherein the first semiconductor device and the second semiconductor device are stacked and are coupled through the unidirectional through electrode and the first to fourth bidirectional through electrodes.

16. The semiconductor chip according to claim 15, wherein the second semiconductor device comprises:

a second path control circuit configured to receive and output first to fifth signals by replacing a path of a through electrode in which a failure has occurred among the unidirectional through electrode and the first to fourth bidirectional through electrodes, with an adjacent through electrode, based on the first to fifth transfer control signals, in a write operation and a read operation.

17. The semiconductor chip according to claim 16, wherein the second path control circuit comprises:

a sixth transfer circuit configured to generate an internal command from the first signal or block input of the first signal depending on a logic level of the first transfer control signal when the write enable signal is enabled;

a seventh transfer circuit configured to generate fifth data from the second signal when the write enable signal is enabled, and generate the second signal from the fifth data or block input of the fifth data depending on a logic level of the second transfer control signal when the read enable signal is enabled;

an eighth transfer circuit configured to generate sixth data from the third signal when the write enable signal is enabled, and generate the third signal from the fifth data or generate the third signal from the sixth data depending on a logic level of the third transfer control signal when the read enable signal is enabled;

a ninth transfer circuit configured to generate seventh data from the fourth signal when the write enable signal is enabled, and generate the fourth signal from the sixth data or generate the fourth signal from the seventh data depending on a logic level of the fourth transfer control signal when the read enable signal is enabled; and a tenth transfer circuit configured to generate eighth data from the fifth signal when the write enable signal is enabled, and generate the fifth signal from the seventh data or generate the fifth signal from the eighth data depending on a logic level of the fifth transfer control signal when the read enable signal is enabled.

18. The semiconductor chip according to claim 17, wherein the sixth transfer circuit receives the first signal by being coupled to the unidirectional through electrode, the seventh transfer circuit receives and outputs the second signal by being coupled to the first bidirectional through electrode, the eighth transfer circuit receives and outputs the third signal by being coupled to the second bidirectional through electrode, the ninth transfer circuit receives and outputs the fourth signal by being coupled to the third bidirectional through electrode, and the tenth transfer circuit receives and outputs the fifth signal by being coupled to the fourth bidirectional through electrode.

* * * * *